United States Patent
Tsuchiya et al.

(10) Patent No.: US 7,067,427 B2
(45) Date of Patent: Jun. 27, 2006

(54) MANUFACTURING METHOD OF SEMICONDUCTOR DEVICE

(75) Inventors: Yasuaki Tsuchiya, Kanagawa (JP); Tomoko Inoue, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/619,001

(22) Filed: Jul. 15, 2003

(65) Prior Publication Data

US 2004/0023483 A1    Feb. 5, 2004

(30) Foreign Application Priority Data

Aug. 2, 2002    (JP) .............................. 2002-225735

(51) Int. Cl.
*H01L 21/302* (2006.01)
(52) U.S. Cl. ..................................... 438/691
(58) Field of Classification Search ............... 438/626, 438/627, 631, 633, 637, 642–643, 645, 648, 438/689–693
See application file for complete search history.

(56) References Cited

U.S. PATENT DOCUMENTS

| | | | | |
|---|---|---|---|---|
| 6,136,680 A * | 10/2000 | Lai et al. | ..................... | 438/597 |
| 6,214,721 B1 * | 4/2001 | Bendik et al. | .............. | 438/624 |
| 6,524,167 B1 * | 2/2003 | Tsai et al. | ..................... | 451/41 |
| 6,551,935 B1 * | 4/2003 | Sinha et al. | ................ | 438/693 |
| 6,679,929 B1 * | 1/2004 | Asano et al. | ................. | 51/308 |
| 2003/0166337 A1 * | 9/2003 | Wang et al. | ................ | 438/689 |

FOREIGN PATENT DOCUMENTS

| | | |
|---|---|---|
| JP | 7-233485 | 9/1995 |
| JP | 8-83780 | 3/1996 |
| JP | 10-116804 | 5/1998 |
| JP | 11-238709 | 8/1999 |
| JP | 2000-133621 | 5/2000 |
| JP | 2000-243730 | 9/2000 |
| JP | 2001-187878 | 7/2001 |
| JP | 2001-189296 | 7/2001 |
| JP | 2002-164308 | 6/2002 |
| JP | 2002-164309 | 6/2002 |
| JP | 2002-164310 | 6/2002 |

* cited by examiner

*Primary Examiner*—Scott Geyer
(74) *Attorney, Agent, or Firm*—Young & Thompson

(57) ABSTRACT

A method of manufacturing a semiconductor device includes the steps of forming a sunken section in an insulating film formed on a substrate and forming a barrier metal film on the insulating film inclusive of the sunken section. The method also includes forming a copper-based film over the entire surface so as to fill up the sunken section and forming a copper-based metal interconnection. The interconnection is formed by polishing this substrate surface by the chemical mechanical polishing method, using a polishing slurry containing a silica polishing material, an oxidizing agent, an amino acid, a triazole-based compound and water. A content ratio of the amino acid to the triazole-based compound (amino acid/triazole-based compound (weight ratio)) is 5 to 8.

8 Claims, 2 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device, which has the step of forming a buried type copper-based metal interconnection.

2. Description of the Related Art

In the formation of a semiconductor integrated circuit such as an ULSI for which progress to attain further miniaturization and more densely spaced arrangement has been gathering more speed, copper is a particularly useful material of the electrical connection for forming the interconnection of good performance and high reliability, because of its low electrical resistance and high resistance against the electromigration and the stress migration.

Since it is difficult to work copper into shape by means of dry etching, a copper interconnection is currently formed by so-called damascene method, for instance, in the following way.

Firstly, a sunken section such as a trench or a connection hole is formed in an insulating film formed on a silicon substrate. Next, after a barrier metal film is formed on the surface inclusive of the inside of this sunken section, a copper film is grown by the plating method so as to fill up this sunken section. Polishing is then carried out by the chemical mechanical polishing (referred to as "CMP" hereinafter) method until the surface of the insulating film other than the sunken section is completely exposed, so that the surface may be planarized. Thereby, the formation of an electrical connection section such as a buried copper interconnection, a via plug or a contact plug, which is made of copper filling the sunken section with a barrier metal film lying therebetween, is accomplished.

For the CMP slurry used in the formation of a copper interconnection of this sort, a slurry which contains an oxidizing agent and a polishing material as the main components and further comprises an organic acid such as an amino acid or a carboxylic acid, is generally used.

For example, in Japanese Patent Application Laid-open No. 233485/1995, there is disclosed a polishing agent for a copper-based metal which contains an oxidizing agent (hydrogen peroxide), polishing grains, water and at least one type of an organic acid selected from the group consisting of aminoacetic acid (glycine) and amidosulfuric acid. Further, it is described therein that, with such a polishing agent being used, through the oxidation effect of the afore-mentioned oxidizing agent, an oxide layer is formed, on the surface of copper or copper alloy, to serve as an etching barrier, while this copper or copper alloy is immersed in the agent, and in polishing copper or copper alloy, the removal of the afore-mentioned oxide layer is made mechanically, and the afore-mentioned organic acid facilitates to etch the exposed copper or copper alloy.

Further, in Japanese Patent Application Laid-open No. 83780/1996, there are disclosed a polishing agent which contains an oxidizing agent (hydrogen peroxide), water, benzotriazole or its derivative, a polishing agent containing polishing grains and aminoacetic acid (glycine) and/or amidosulfuric acid; and a polishing method wherein a CMP is carried out using this polishing agent to form a film of copper or copper alloy within a sunken section of a substrate. Further, it is described therein that, by performing the CMP with this polishing agent, a protective film is formed on the film that is to be polished so as to prevent the isotropic chemical etching from occurring, and then the removal of this protective film is made, by mechanical polishing, on the surface of the raised section of the film for polishing, and, thereby, a conductive film of high reliability with little dishing or damage can be formed.

Further, in Japanese Patent Application Laid-open No. 238709/1999, there is disclosed a CMP slurry for copper polishing, which contains citrate, an oxidizing agent (hydrogen peroxide), a polishing material and 1,2,4-triazole or benzotriazole. Further, it is described therein that the use of the CMP slurry can improve the removing rate of copper and the addition of the afore-mentioned triazole or benzotriazole can raise the planarity of the copper layer.

In recent years, as the semiconductor integrated circuit has been increasingly miniaturized and its arrangement, more densely spaced, the increase in interconnection resistance and further complication of the logic circuits which result from the miniaturization of the interconnection have become problems to be coped with, and the employment of the multi-layered interconnection which can reduce the interconnection length has become more and more spreading. Accompanying the increase in the number of layers through the employment of the multi-layered interconnection structure, however, the unevenness of the substrate surface grows and the difference in level widens. The enlargement of the difference in level, owing to the employment of the multi-layered structure may cause various problems including the short-circuited interconnection and the leakage of current, both of which may be brought about by metal residues left in the sunken section of the upper layer(s) after the CMP, and the focus shift in the step of lithography. Therefore, it is essential for the slurry not to create substantial dishing (in other words, to provide a high planarity). Further, in the multi-layered interconnection, the top layer section of the interconnection is used for the interconnection for power supply, the interconnection for signal or the interconnection for clock, and for the sake of lowering these interconnection resistances to reduce the voltage change and improve various characteristics, it is required to make the interconnection trench deep and form thick interconnections. In such a case as a thick copper film is formed and, then, a copper interconnection is formed, the polishing amount of copper which is to be removed in the step of one CMP increases and, thus, the time required for the step of polishing becomes considerably long, giving rise to a problem of lowering the throughput. As a result, copper polishing at a higher polishing rate is strongly demanded.

In general, in order to polish copper at a high polishing rate, the amounts of components for copper etching such as the oxidizing agent and the acid, which are contained in the polishing slurry, are made higher to raise their chemical effects. However, if the chemical effects of the polishing slurry are too strong, even the copper formed as the buried section may be etched to create a hollow (dishing), and the reliability for the electrical connection section such as the interconnection and the via plug may fall.

Further, with the intention of suppressing dishing in the copper interconnection or the like, if the content of the dishing inhibitor such as benzotriazole or 1,2,4-triazole is made too high, the polishing rate (the removing rate) of copper may drop a great deal. Further, there become liable to arise problems that polishing may generate strong vibrations and that, in a state where the barrier metal film is exposed, the interconnection edge damage may grow with the exposed section of the barrier metal film being the starting point.

It is, therefore, difficult to polish copper at a high polishing rate, and, at the same time, prevent the dishing from occurring satisfactorily.

SUMMARY OF THE INVENTION

An object of the present invention is to provide a manufacturing method of a semiconductor device, wherein a copper-based metal film can be polished at a high polishing rate, while dishing is well prevented from occurring, and, consequently, a buried-type copper-based metal interconnection can be formed with a high throughput.

In light of the above problems, the present inventors conducted investigations into the composition of the polishing slurry, paying special attention to the organic acid and the triazole-based compound, and found out that the polishing rate markedly increases when, with an amino acid being employed as the organic acid, the content ratio of the amino acid to the triazole-based compound is within a specific range. An effect of this sort cannot be seen, if a carboxylic acid, which is widely employed as the organic acid, is used instead. In addition to this, the present inventors found out that, the etching rate with an amino acid being used as the organic acid becomes lower than that with a carboxylic acid being used, and these findings led to the present invention.

Accordingly, the present invention relates to a method of manufacturing a semiconductor device, comprising the steps of:

forming a sunken section in an insulating film formed on a substrate;

forming a barrier metal film on said insulating film inclusive of said sunken section;

forming a copper-based film over the entire surface so as to fill up said sunken section; and forming a copper-based metal interconnection, which comprises the step of polishing this substrate surface by the chemical mechanical polishing method, using a polishing slurry containing a silica polishing material, an oxidizing agent, an amino acid, a triazole-based compound and water, wherein a content ratio of said amino acid to said triazole-based compound (amino acid/triazole-based compound (weight ratio)) is 5 to 8.

Further, the present invention relates to a method of manufacturing a semiconductor device, comprising the steps of:

forming a sunken section in an insulating film formed on a substrate;

forming a barrier metal film on said insulating film inclusive of said sunken section;

forming a copper-based film over the entire surface so as to fill up said sunken section; and polishing this substrate surface by the chemical mechanical polishing method to form a copper-based metal interconnection, wherein said step of polishing comprises the steps of:

a first polishing which is performed until at least a part of said barrier metal film is exposed, while using a polishing slurry containing a silica polishing material, an oxidizing agent, an amino acid, a triazole-based compound and water, wherein a content ratio of said amino acid to said triazole-based compound (amino acid/triazole-based compound (weight ratio)) is 5 to 8; and a second polishing which is performed until the surface of the insulating film other than said sunken section is exposed.

In the present invention, the "sunken section" formed in the insulating film includes the trench to form the buried interconnection and the connection hole such as the contact hole and the through hole. Further, the "insulating film formed on the substrate" implies not only the insulating film formed immediately on the substrate but also the interlayer insulating film formed over the substrate with one or more other layers such as a lower interconnection layer being interposed therebetween.

The present invention can polish the copper-based metal film at a high polishing rate while preventing the dishing from occurring satisfactorily, and, in consequence, can produce the semiconductor device of good reliability with a high throughput.

DETAILED DESCRIPTION OF PREFERRED EMBODIMENTS

Figure 1:
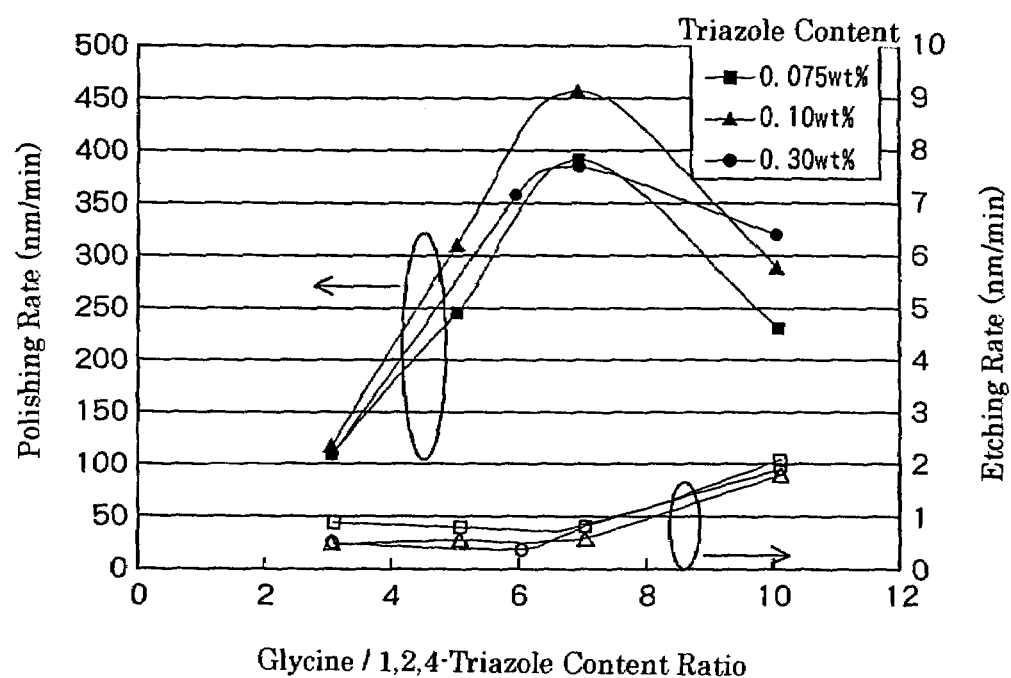
FIG. 1 is a graph showing the relationships between the content ratio of glycine to 1,2,4-triazole in the polishing slurry and the polishing rate, and the etching rate.

The preferred embodiments of the present invention are described below.

In a manufacturing method of a semiconductor device of the present invention, there is performed, within the step of forming a buried-type copper-based interconnection with what is called a damascene structure, the step of polishing a copper-based metal film by the chemical mechanical polishing method, using a specific polishing slurry, namely, a polishing slurry containing a silica polishing material, an oxidizing agent, an amino acid, a triazole-based compound and water, wherein a content ratio of the afore-mentioned amino acid to afore-mentioned triazole-based compound (amino acid/triazole-based compound (weight ratio)) is 5 to 8. The present invention can raise the polishing rate of the copper-based metal film a great deal, while preventing the dishing from occurring in the step of polishing, and, thus, can manufacture a semiconductor device of good reliability with a high throughput.

In more preferred embodiments of a manufacturing method of a semiconductor device of the present invention, there are performed, within the step of forming an interconnection, the step of polishing which comprises the step of a first polishing wherein mainly a copper-based metal film is polished and removed, and the step of a second polishing wherein mainly a barrier metal film is polished and removed.

The barrier metal film is formed as a base film with the intention of preventing diffusion from the copper-based metal film to an insulating film and the like, and its polishing rate is, in general, different from the polishing rate for the copper-based metal film. For instance, since a tantalum-based metal film that is currently regarded best suited to the barrier metal film and widely used as such is chemically very stable, its polishing rate tends to become smaller than that for the copper-based metal film. In consequence, even a polishing slurry well-suited to the polishing of the copper-based metal film may be liable to cause a problem of dishing or the like at the time of the barrier metal polishing, because the difference between the polishing rates for the copper-based metal film and the barrier metal film is considerable.

Accordingly, the step of polishing in the present embodiment is divided into two steps; the step of a first polishing wherein mainly a copper-based metal film is polished and removed and the step of a second polishing wherein mainly a barrier metal film is polished and removed; and the polishing in each step is performed using a polishing slurry best suited to that polishing. In the present embodiment, the afore-mentioned specific polishing slurry (referred to as a "first polishing slurry" hereinafter), which is capable to suppress the etching power against the copper-based metal film as well as provide a high polishing rate for the copper-based metal film, is employed as a polishing slurry that is specifically used in the step of the first polishing, and this makes it possible to form a buried-type copper-based metal film with a high throughput, while preventing the dishing from occurring.

The first polishing slurry contains a silica polishing material (polishing grains), an oxidizing agent, an amino acid and a triazole-based compound.

As a polishing material in the first polishing slurry, it is preferable to use a silica polishing material such as colloidal silica or fumed silica, from the viewpoints that it produces few scratches on the polished face and it has excellent dispersion stability. Especially, colloidal silica is preferable because this, in particular, hardly produces scratches, owing to its spherical grain shape and uniform grain size, and besides this is available with a high purity and numerous types of grade for the particle size are also provided.

In respects of the polishing rate, the dispersion stability, the surface roughness of the polished face and the like, the average particle size of the silica polishing material, measured by the light scattering diffraction method, is preferably not less than 5 nm, more preferably not less than 10 nm and still more preferably not less than 20 nm, but preferably not greater than 100 nm, more preferably not greater than 50 nm and still more preferably not greater than 30 nm.

A content of the silica polishing material to the total amount of the first polishing slurry is appropriately set within a range of 0.1 to 50 wt %, taking the polishing efficiency, the polishing accuracy and the like into consideration. In particular, from the viewpoints of the polishing rate, the dispersion stability, the surface roughness of the polished face and the like, it is set preferably not less than 0.5 wt % and more preferably not less than 1 wt %, but preferably not greater than 10 wt % and more preferably not greater than 5 wt %.

An oxidizing agent contained in the first polishing slurry may be appropriately selected from well known water-soluble oxidizing agents, taking the polishing accuracy and the polishing efficiency into consideration. For example, those which may cause little metal ion contamination include peroxides such as $H_2O_2$, $Na_2O_2$, $Ba_2O_2$ and $(C_6H_5C)_2O_2$; hypochlorous acid (HClO); perchloric acid; nitric acid; ozone water; peracetic acid; nitrobenzene and organic peroxides. Among these, hydrogen peroxide ($H_2O_2$) is preferable because it does not contain a metal component or does not generate a harmful byproduct.

A content of the oxidizing agent to the total amount of the first polishing slurry is appropriately set within a range of 0.01 to 10 wt %, taking the polishing efficiency, the polishing accuracy and the like into consideration. The content thereof is preferably not less than 0.1 wt % and more preferably not less than 0.2 wt % to achieve a better polishing rate; but preferably not greater than 5 wt % and more preferably not greater than 2 wt % to suppress the dishing and regulate the polishing rate. When the content of the oxidizing agent is too low, the chemical effects of the polishing slurry become small so that the polishing rate obtained may become insufficient or the damage may become liable to happen on the polished face. On the other hand, when the content of the oxidizing agent is too high, the dishing may become liable to happen or copper oxide (CuO) may be excessively formed on the surface of the copper-based metal film, which may bring about, through the inhibition of adsorption of the triazole-based compound, undesirable results such as a lowering of the polishing rate and the rough polished surface.

In the case that hydrogen peroxide is utilized as an oxidizing agent, an excellent polishing slurry can be obtained by adding, for example, an aqueous solution of hydrogen peroxide with a concentration of 30 wt % to a concentration of 1 to 5 wt % in the slurry ($H_2O_2$ concentration: 0.3 to 1.5 wt %). Nevertheless, when such an oxidizing agent relatively susceptible to deterioration with age as hydrogen peroxide is utilized, it may be possible to prepare separately a solution containing, together with a stabilizer and the like, an oxidizing agent at a given concentration, and a composition which is to provide a prescribed polishing slurry on addition of the solution containing the oxidizing agent, and then mix them just before use.

An amino acid that the first polishing slurry contains is an essential component. If this amino acid and a triazole-based compound are contained therein at a specific ratio as described below, the dishing can be well prevented from occurring, and besides a copper-based metal film can be polished at a high polishing rate.

An amino acid in the first polishing slurry may be added as a single substance or added as a salt or a hydrate. Examples thereof include arginine, arginine hydrochloride, arginine picrate, arginine flavianate, lysine, lysine hydrochloride, lysine dihydrochloride, lysine picrate, histidine, histidine hydrochloride, histidine dihydrochloride, glutamic acid, sodium glutaminate monohydrate, glutamine, glutathione, glycylglycine, alanine, δ-alanine, γ-aminobutyric acid, ε-aminocarproic acid, aspartic acid, aspartic acid monohydrate, potassium aspartate, calcium aspartate trihydrate, tryptophan, threonine, glycine, cysteine, cysteine hydrochloride monohydrate, oxyproline, isoleucine, leucine, methionine, ornithine hydrochloride, phenylalanine, phenylglycine, proline, serine, tyrosine and valine. It is also possible to add two or more different types of amino acids selected therefrom. Among these amino acids, glycine is preferable in respects of the polishing rate and the suppressing effect on the dishing. Further, as glycine is highly soluble, glycine is preferable also in respect of the production of the polishing slurry, and, in addition to that, glycine is available at a low price so that its use enables the low cost production of the polishing slurry.

With regard to a content of the amino acid in the first polishing slurry, it is essential to set this content in such a way that a content ratio of the amino acid to the triazole-based compound that is to be described below (amino acid/triazole-based compound (weight ratio)) is in a range of 5 to 8. This content ratio is set in a range of preferably 5 to 7.5, more preferably 5 to 7 and still more preferably 6 to 7. When this content ratio is too small, the polishing ratio is lowered. However, when this content ratio is too large, the polishing ratio is again lowered. Further, in this case (in the case the content ratio is too large), namely, when the amino acid is excess and/or when the triazole-based compound is scarce, the dishing becomes liable to happen.

The first polishing slurry may contain another organic acid other than the afore-mentioned amino acid as far as the prescribed characteristics are not adversely affected. An addition of an organic acid may facilitate an oxidizing agent to dissolve copper and to carry out polishing stably.

Examples of such an organic acid include various carboxylic acids, for instance, oxalic acid, malonic acid, tartaric acid, malic acid, glutaric acid, citric acid, maleic acid, formic acid, acetic acid, propionic acid, butyric acid, valeric acid, acrylic acid, lactic acid, succinic acid, nicotinic acid and their salts.

The first polishing slurry further contains a triazole-based compound. By this triazole-based compound, a protective film is formed on the surface of the copper-based metal film, which blocks the etching effect (chemical effect) thereon except at the time of being polished and, thus, prevents the dishing from occurring. Further, as described above, by being contained at a specific ratio to the amino acid, the triazole-based compound can raise the polishing rate.

A content of the triazole-based compound in the first polishing slurry is preferably not less than 0.05 wt %, more preferably not less than 0.06 wt % and still more preferably not less than 0.07 wt %, but preferably not greater than 0.5 wt %, more preferably not greater than 0.4 wt % and still more preferably not greater than 0.3 wt %. When the content of the triazole-based compound is too low, the etching rate increases and the extent of dishing becomes larger. On the other hand, when the content of the triazole-based compound is too high, the polishing rate drops, although the suppressing effects on the dishing can remain.

A triazole-based compound in the first polishing slurry implies triazole or its derivative. Examples of a triazole-based compound include 1,2,4-triazole, 1,2,3-triazole and their derivatives (substitution products having at least a substituent attached to a carbon atom in the heterocyclic five-membered ring). As examples of a substituent attached to a carbon atom in the heterocyclic five-membered ring of triazole, there can be given hydroxy group; alkoxy group such as metoxy group and ethoxy group; amino group; nitro group; alkyl group such as methyl group, ethyl group and butyl group; and halogen substituent group such as fluorine, chlorine, bromine and iodine, and, herein, it is possible that only one of two carbons in the heterocyclic five-membered ring have a substituent or both carbons have each, either the same type or different substituent. Among these compounds, 1,2,4-triazole is preferable because of its water solubility and its acquisition cost such as price.

A pH value of the first polishing slurry is set to be preferably in a range of pH 3 to 8, viewed from the points of the polishing rate, the prevention of dishing, the corrosion and surface roughness on the polished face, the viscosity of the slurry and the dispersion stability. Especially, in respects of the polishing rate and the prevention of dishing, pH 5 to 7 is more preferable, and further, with the dispersion stability of the polishing material considered, pH 6 to 7 is more preferable, and pH 6.5 to 7 is particularly preferable. When the pH is too low, the etching power may become strong and the dishing may become liable to happen. On the other hand, when the pH is too high, the effect of the oxidizing agent becomes weaker and, moreover, the handling easiness of the slurry becomes lowered, regarding safety. In addition, when the pH is excessively high, the etching power becomes so strong that the extent of the dishing tends to increase, again.

The pH of the first polishing slurry may be adjusted by any well-known method, and examples of an alkali which may be employed for that include alkali metal hydroxides such as sodium hydroxide and potassium hydroxide; alkali metal carbonates such as sodium carbonate and potassium carbonate; ammonia; and amines. Among them, ammonia and amines which contain no metal component are preferable.

The first polishing slurry may contain a variety of additives such as a dispersing agent, a buffer agent and a viscosity modifier, which are in wide use as common additives to the polishing slurry, provided that it does not affect adversely the properties of the slurry.

For a method of preparing the first polishing slurry, an ordinary method of preparing an aqueous polishing slurry composition with free grains can be applied. Specifically, an appropriate amount of a polishing material is added to an aqueous solvent and then, if necessary, with an appropriate amount of a dispersing agent being added, a treatment of dispersion is carried out. In the step of the dispersion, for example, an ultrasonic disperser, a bead mill disperser, a kneader disperser, a ball mill disperser or the like may be used, according to the circumstances.

The first polishing slurry well suited to the step of the first polishing has been so far described. For a polishing slurry suitable to the step of a second polishing (referred to as a "second polishing slurry" hereinafter), there is no specific limitations as far as the slurry can polish the barrier metal film efficiently without creating the dishing, but a polishing slurry wherein a ratio of polishing rates for the copper-based film to the barrier metal film (copper-based metal/barrier metal film) can be set in a range of 0.5 to 3 and preferably 0.7 to 2.5 may be employed. Further, a slurry possible to adjust a ratio of polishing rates of the insulating film to the barrier metal film (insulating film/barrier metal) to be in a range of 0.01 to 0.5 is preferable.

As a second polishing slurry of this sort, for instance, a polishing slurry that has been disclosed in Japanese Patent Application Laid-open No. 189296/2001 by the present inventors may be utilized.

For instance, a polishing slurry containing a silica polishing material, a polycarboxylic acid having two or more carboxy groups in one molecule and water may be used. Further, in order to promote polishing of the copper-based metal film remaining on the barrier metal film, an oxidizing agent such as hydrogen peroxide may be contained in the slurry.

As a silica polishing material, for instance, fumed silica or colloidal silica may be used. With the silica polishing material, a polishing slurry which produces few scratches on the polished face and has a high dispersion stability can be obtained. The average particle size of the silica polishing material and the content thereof to the total amount of the slurry in the polishing slurry may be appropriately set within ranges of 5 to 500 nm and 0.1 to 50 wt %, respectively, taking the polishing efficiency, the polishing accuracy and the like into consideration.

As a polycarboxylic acid, oxalic acid, malonic acid, tartaric acid, malic acid, glutaric acid, citric acid, maleic acid or a salt of any of these acids may be used. Alternatively, two or more types of these can be used together. A content of the polycarboxylic acid in the polishing slurry may be set in a range of 0.01 to 1 wt % with the polishing rate for the tantalum-based metal film, thixotropic nature of the slurry and the like considered.

A pH value of this polishing slurry may be set appropriately in a range of pH 4 to 9, in respects of the polishing rate, the dispersion stability, the viscosity of the slurry and the like.

The second polishing slurry may contain a variety of additives such as a dispersing agent, a buffer agent and a viscosity modifier, which are in wide use as common additives to the polishing slurry, provided that it does not affect adversely the properties of the slurry. Further, with the same purpose as that for the first polishing slurry, an organic acid such as a carboxylic acid or an amino acid may be contained therein.

By containing a silica polishing material and a polycarboxylic acid, this polishing slurry can raise the polishing rate for the tantalum-based metal film a great deal, while preventing scratches from appearing on the polished face. Accordingly, the difference between polishing rates for the tantalum-based metal film and the copper-based metal film can be made small and the ratio of the polishing rates can be adjusted to a prescribed value so that an excellent buried interconnection where the dishing is well suppressed can be formed.

The CMPs using a first polishing slurry and a second polishing slurry so far described may be, for example, conducted, as follows. Firstly, there is provided a substrate, wherein an insulating film is formed and a sunken section in prescribed pattern shape is formed in the insulating film and, thereon, a copper-based metal film is grown. This substrate is placed on a wafer carrier such as a spindle. With a prescribed pressure applied, the surface of this copper-based metal film in this substrate is made to contact with a polishing pad which is adhered onto a surface plate such as a rotary plate, and while supplying a polishing slurry between the substrate and the polishing pad, the wafer and the polishing pad are moved relative to each other (for instance, both of them are rotated) and thereby the wafer is polished. The polishing slurry may be supplied onto the polishing pad from a supply tube set separately or it may be supplied onto the surface of the polishing pad from the side of the surface plate. If necessary, a pad conditioner may be brought into contact with the surface of the polishing pad to condition the surface of the polishing pad.

In the step of the first polishing, the copper-based metal film is polished and removed until at least a part of the barrier metal film is exposed. The polishing can be performed until the barrier metal film other than the sunken section is completely exposed, but the copper-based metal film left on the barrier metal other than the sunken section can be removed anyway, together with the barrier metal film, in the step of the second polishing.

In the step of the second polishing, mainly the barrier metal film is polished and removed until the surface of the insulating film other than the sunken section is exposed. Herein, "exposed" implies that the surface of the insulating film other than its sunken section is "substantially completely or completely exposed". In other words, it is possible to perform the polishing until the surface of the insulating film other than its sunken section is completely exposed, but it is also possible to leave some barrier metal on the insulating film even after the second polishing as long as it does not bring about deterioration of element characteristics through an electrical shorted-circuit in the interconnection and the like.

The termination of the polishing in the step of each polishing can be made, for example, in the following ways.

(1) The polishing rate for that particular metal film is measured in advance, and a time required to remove the metal film with a prescribed thickness is determined by calculation, and the polishing is terminated when a certain given time passes after that estimated time period from the starting time thereof elapses.

(2) The CMP is conducted while monitoring the polishing rate and the polishing is terminated when a certain given time passes after the time the polishing rate starts falling rapidly.

(3) The CMP is conducted while measuring changes in rotation torque to a rotation axis with a rotation torque meter being set on the rotation axis of the rotary plate. And the polishing is terminated when a certain given time passes after detecting a change in rotation torque that occurs along with exposure of the barrier metal film, the metal film being removed.

(4) The light is irradiated to a polished surface and the CMP is applied thereto while measuring the reflected light. In short, as the polishing proceeds from a metal film for interconnection to a barrier metal film, and then to an insulating film, the material present on the polished surface changes and, accordingly, the intensity of the reflected light changes. The polishing is terminated when a certain given time passes after the intensity of the reflected light starts changing.

(5) In the step of the first polishing, the polishing is terminated when a certain given time passes after the barrier metal film starts being exposed, which is determined on the basis of the pre-obtained relationship between the polishing time period and the area ratio of the remaining metal film for interconnection.

Further, the termination of the polishing can be determined by an appropriate combination of the above methods.

The step of polishing described above is the most effective when a sunken section such as a trench or a connection hole is formed in an insulating film laid on a substrate, a copper-based metal film is formed over the entire surface thereof so as to fill up this sunken section with a barrier metal film lying therebetween, and by polishing the copper-based metal film, an electrical connection section such as a buried interconnection, a via plug, a contact and the like is formed. As an insulating film, there can be given a silicon oxide film, a BPSG (Boron-Phosphorous-Silicate Glass) film, a SOG (Spin-on-Glass) film, a SiOF film, a HSQ (Hydrogen Silses-Quioxane) film, a SiOC film, a MSQ (Methyl-Silses-Quioxane) film, a polyimide film, a Parylene® film (polyparaxylylene film), a Teflon® film and an amorphous carbon film. As a barrier metal film well suited to the copper-based metal film, that is, the copper film or the copper alloy film whose main component is copper, there can be given a tantalum-based metal film made of tantalum (Ta), a tantalum nitride, tantalum silicon nitride or the like.

The step of polishing described above is applicable to the step of forming a buried interconnection in conventional manufacturing methods of various semiconductor devices, for instance, the step of forming an upper interconnection layer in a multi-layered interconnection structure and the step of forming a dual damascene interconnection.

EXAMPLES

The step of polishing mainly with a first polishing slurry is further described in detail below.

CMP Conditions

The CMP was carried out using a polisher SH-24 made by SpeedFam Co., Ltd. The polisher was used, onto a surface plate of which a polishing pad (IC 1400, made by Rodel Nitta Company) with a diameter of 61 cm was attached. Polishing conditions were as follows; a contact pressure of the polishing pad: 27.6 kPa, a polishing area of the polishing pad: 1820 $cm^2$, a rotating speed of the surface plate: 55 rpm; a carrier rotating speed: 55 rpm; and a feeding rate of the slurry polishing agent: 100 ml/min.

For a substrate for polishing, a substrate in which a copper film was grown on a Si substrate by the sputtering method was used.

Measurement of Polishing Rate

The polishing rate was calculated from the surface resistivities before and after the polishing as follows. Four needle electrodes were aligned on the wafer with a given interval, and with a given current being applied between two outer probes, a potential difference between two inner probes was measured to determine a resistance (R'), and further a surface resistivity (ρs') was obtained by multiplying that value by a correction factor RCF (Resistivity Correction Factor). A surface resistivity (ρs) for another wafer film with a known thickness (T) (nm) was also obtained. Since the surface resistivity is inversely proportional to the thickness, if a thickness for the wafer with the surface resistivity of ρs' is taken as d, an equation $$d(\text{nm}) = (\rho s \times T)/\rho s'$$

is given. Using this equation, the thickness d can be determined, and the polishing rate was then estimated by dividing the difference between film thicknesses before and after the polishing by the polishing time. For the measurements of the surface resistivity, a surface resistance detector (Four Probe Resistance Detector, Loresta-GP, made by Mitsubishi Chemical Corporation) was used.

Measurement of Etching Rate

A Si substrate on which a Cu film was grown was cleaved into a size of 1.2×1.2 cm² and this was subjected to an immersion in 50 ml of a polishing slurry at 25° C. for 30 minutes. The surface resistivities (ρs') of the Cu film before and after the immersion were measured by the surface resistance detector (Four Probe Resistance Detector, Loresta-GP, made by Mitsubishi Chemical Corporation). Using the afore-mentioned relationship equation "d (nm)= (ρs×T)/ρs'", the film thickness after the immersion was obtained and then the etching rate was calculated by dividing the difference between film thicknesses before and after the immersion by the immersion time.

Estimation of Dispersion Stability

Using a self-recording spectrophotometer (U-4000 Type, made by Hitachi, Ltd.), the transmittances of the slurry were measured immediately after the preparation of the slurry and after 3000 hours from the preparation.

Preparation of Polishing Slurry and Results of Estimation

A number of slurries each of which contained 5 wt % of colloidal silica (TSOL Series, made by Tama Chemicals Co., Ltd.; primary particle size: approximately 30 nm), 2 wt % of an aqueous solution of 30 wt % hydrogen peroxide (the amount of $H_2O_2$: 0.6 wt %), 1,2,4-triazole, glycine and water were prepared. The contents of 1,2,4-triazole and glycine in each slurry are listed in Table 1. Further, the pH value of each slurry was adjusted to be within a range of 6.5 to 7 with an aqueous solution of ammonia.

The results of measurements of the polishing rate and the etching rate for each slurry are shown in Table 1 and FIG. 1. These results show that a high polishing rate can be obtained when the content ratio of glycine to 1,2,4-triazole (glycine content ratio) is in a specific range. Further, it is clearly seen that the etching ratio increases with higher glycine content ratios. These results indicate that, in order to suppress etching satisfactorily, in other words, in order to prevent dishing from occurring and, at the same time, obtain a high polishing rate, it is preferable for the glycine content ratio to be in a range of 5 to 8, and especially in a range of 6 to 7.

TABLE 1

| Slurry No. | 1,2,4-triazole content (wt %) | Glycine content ratio | Polishing Rate (nm/min) | Etching Rate (nm/min) |
|---|---|---|---|---|
| 1 | 0.075 | 3 | 110 | 0.9 |
| 2 | 0.075 | 5 | 249 | 0.8 |
| 3 | 0.075 | 7 | 395 | 0.8 |
| 4 | 0.075 | 10 | 230 | 2.2 |
| 5 | 0.1 | 3 | 120 | 0.5 |
| 6 | 0.1 | 5 | 310 | 0.6 |
| 7 | 0.1 | 7 | 455 | 0.6 |
| 8 | 0.1 | 10 | 280 | 1.7 |
| 9 | 0.3 | 3 | 110 | 0.5 |
| 10 | 0.3 | 6 | 360 | 0.4 |
| 11 | 0.3 | 7 | 370 | 0.8 |
| 12 | 0.3 | 10 | 320 | 1.8 |

$H_2O_2$ content (wt %): 0.6 wt %

The results of measurements of the polishing rate at a glycine content ratio of 7 with various hydrogen peroxide contents are shown in Table 2. These results demonstrate that even if the content of hydrogen peroxide increases more than necessary, a high polishing rate cannot be obtained and, on the contrary, a decrease in polishing rate may be brought about.

TABLE 2

| Slurry No. | $H_2O_2$ content (wt %) | 1,2,4-triazole content (wt %) | Glycine content ratio | Polishing rate (nm/min) |
|---|---|---|---|---|
| 7 | 0.6 | 0.1 | 7 | 455 |
| 13 | 0.9 | 0.1 | 7 | 690 |
| 14 | 1.5 | 0.1 | 7 | 450 |
| 15 | 3.0 | 0.1 | 7 | 380 |

Figure 2:
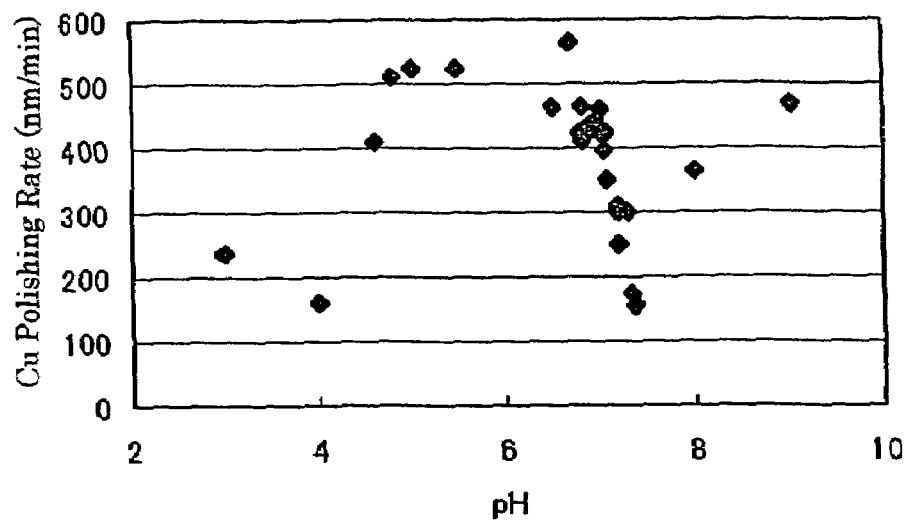
FIG. 2 is a graph showing the relationship between the pH of the polishing slurry and the polishing rate.

The results of measurements of the polishing rate obtained using slurries with various pH whose glycine content ratio is 6 are shown in FIG. 2. These results indicate that high polishing rates may be obtained at pH 5 to 7.

Figure 3:
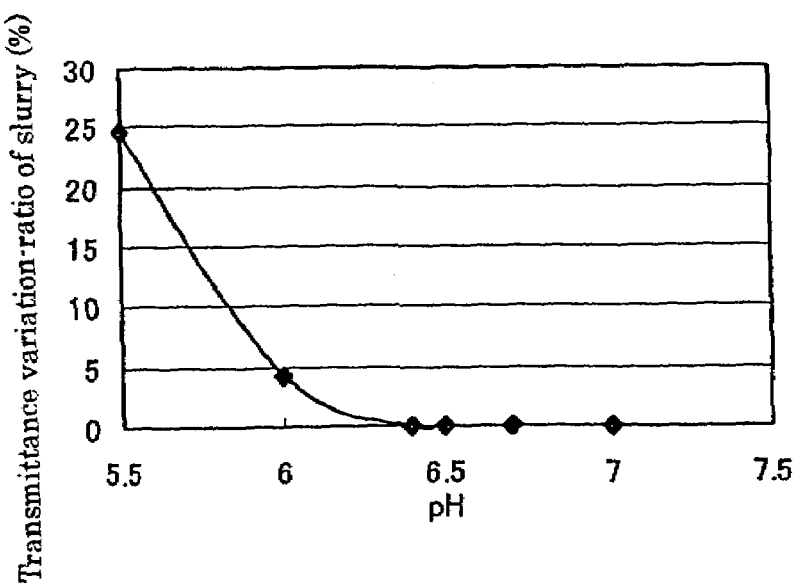
FIG. 3 is a graph showing the relationship between the pH of the polishing slurry and the transmittance variation-ratio thereof.

The results of measurements of the transmittance of the polishing slurry obtained using slurries with various pH whose glycine content ratio is 6 are shown in FIG. 3. The numbers on the ordinate in FIG. 3 indicate variation-ratios of the transmittance measured after 3000 hours from the preparation of the slurry to the transmittance measured immediately after the preparation. These results indicate that at a pH not less than 6 and especially at a pH not less than 6.5, the slurry shows an excellent dispersion stability.

As Case for Comparison, the results of measurements of the polishing rate and the etching rate for polishing slurries each of which contains benzotriazole in place of 1,2,4-triazole contained in each slurry shown in Table 1 are shown in Table 3. These results demonstrate that, with a polishing slurry containing benzotriazole, a high polishing rate cannot be obtained. It is thought that because benzotriazole is liable to be adsorbed strongly to form a firm coating, a high polishing rate cannot be obtained.

TABLE 3

| Slurry No. | Benzotriazole content (wt %) | Glycine content ratio | Polishing rate (nm/min) | Etching rate (nm/min) |
|---|---|---|---|---|
| 16 | 0.005 | 3 | 42 | 0.9 |
| 17 | 0.005 | 5 | 119 | 0.8 |
| 18 | 0.005 | 7 | 122 | 0.9 |
| 19 | 0.005 | 10 | 98 | 2.5 |
| 20 | 0.01 | 3 | 82 | 0.5 |
| 21 | 0.01 | 5 | 178 | 0.5 |
| 22 | 0.01 | 7 | 152 | 0.6 |
| 23 | 0.01 | 10 | 130 | 1.2 |
| 24 | 0.02 | 3 | 57 | 0.7 |
| 25 | 0.02 | 5 | 140 | 0.8 |
| 26 | 0.02 | 7 | 152 | 0.7 |
| 27 | 0.02 | 10 | 85 | 1.8 |

$H_2O_2$ content (wt %): 0.6 wt %

As Case for Comparison, the results of measurements of the polishing rate and the etching rate for polishing slurries each of which contains tartaric acid or citric acid in place of glycine contained in each slurry shown in Table 1 are shown in Table 4. These results demonstrate that, with a polishing slurry containing a carboxylic acid instead of an amino acid, a high polishing rate cannot be obtained, while suppressing the etching rate.

TABLE 4

| Slurry No. | Carboxylic acid | Carboxylic acid content ratio | Polishing rate (nm/min) | Etching rate (nm/min) |
|---|---|---|---|---|
| 28 | Tartaric acid | 5 | 110 | 1.0 |
| 29 | Tartaric acid | 7 | 145 | 1.8 |
| 30 | Tartaric acid | 10 | 180 | 2.8 |
| 31 | Citric acid | 4 | 240 | 10.0 |
| 32 | Citric acid | 7 | 250 | 17.0 |
| 33 | Citric acid | 10 | 320 | 23.0 |

$H_2O_2$ content (wt %): 0.6 wt %;
1,2,4-triazole content: 0.1 wt %

What is claimed is:

1. A method of manufacturing a semiconductor device, comprising the steps of:
    forming a sunken section in an insulating film formed on a substrate;
    forming a barrier metal film on said insulating film inclusive of said sunken section, said barrier metal film is a tantalum-based metal film;
    forming a copper-based film over the entire surface so as to fill up said sunken section; and
    polishing this substrate surface by the chemical mechanical polishing method to form a copper-based metal interconnection, wherein said step of polishing comprises the steps of:
    a first polishing which is performed until at least a part of said barrier metal film is exposed, while using a first polishing slurry containing a silica polishing material, an oxidizing agent, an amino acid, a triazole-based compound and water, wherein a content ratio of said amino acid to said triazole-based compound (amino acid/triazole-based compound (weight ratio)) is in a range of 5 to 8, said triazole-based compound is one of 1,2,3-triazole, 1,2,4-triazole and their derivatives, a content of said triazole-based compound is not less than 0.05% by weight but not greater than 0.5% by weight, said amino acid is glycine, and a pH value of said polishing slurry is in a range of 5 to 7; and
    a second polishing which is performed until the surface of the insulating film other than said sunken section is exposed, while using a second polishing slurry having a composition different from the first polishing slurry.

2. A method of manufacturing a semiconductor device according to claim 1, wherein said silica polishing material is colloidal silica.

3. The method of manufacturing a semiconductor device according to claim 1, wherein a pH value of said polishing slurry is in a range of 6.5 to 7.

4. The method as claimed in claim 1, wherein the second polishing slurry has a composition having a ratio of polishing rates for the copperbased metal film to the barrier metal film (copper-based metal film/barrier metal film) in a range of 0.5 to 3.

5. The method as claimed in claim 4, wherein the second polishing slurry has a composition having a ratio of polishing rates for the insulating film to the barrier metal film (insulating film/barrier metal film) in a range of 0.01 to 0.5.

6. The method as claimed in claim 1, wherein the second polishing slurry comprises a silica polishing material, an oxidizing agent, a polycarboxylic acid having two or more carboxy groups, and water.

7. The method as claimed in claim 6, wherein the polycarboxylic acid is one of oxalic acid, malonic acid, tartaric acid, malic acid, glutaric acid, citric acid, maleic acid and their salts.

8. The method as claimed in claim 1, wherein the first polishing is stopped before or when the barrier metal film other than the sunken section is completely exposed, and then the second polishing starts.

* * * * *